United States Patent
Froehling et al.

(10) Patent No.: US 6,560,298 B1
(45) Date of Patent: May 6, 2003

(54) METHOD AND APPARATUS FOR CONCURRENT SYNCHRONIZATION AND IMPROVED AUTOMATIC FREQUENCY CONTROL IN A COMMUNICATION DEVICE

(75) Inventors: Timothy P. Froehling, Palatine, IL (US); Louis J. Vannatta, Crystal Lake, IL (US); Scott L. Chamberlain, Algonquin, IL (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 09/318,319

(22) Filed: May 25, 1999

(51) Int. Cl.$^7$ .............................................. H04L 27/16
(52) U.S. Cl. ....................... 375/344; 375/355; 375/365; 455/192.1; 455/192.2
(58) Field of Search ................................ 375/322, 323, 375/325, 326, 327, 331, 342, 343, 344, 354, 355, 362, 365, 366; 455/164.1, 164.2, 165.1, 182.2, 182.1, 136, 255, 257, 260

(56) References Cited

U.S. PATENT DOCUMENTS

| | | | | |
|---|---|---|---|---|
| 5,020,131 A | * | 5/1991 | Isoe ............................. 455/10 |
| 5,121,414 A | | 6/1992 | Levine et al. ................. 375/96 |
| 5,228,025 A | | 7/1993 | Le Floch et al. ............. 370/20 |
| 5,245,611 A | | 9/1993 | Ling et al. ................ 370/100.1 |
| 5,280,644 A | | 1/1994 | Vannatta et al. ............. 455/265 |
| 5,282,228 A | | 1/1994 | Scott et al. .................... 375/97 |
| 5,495,506 A | * | 2/1996 | Shoji ........................... 375/344 |
| 5,500,878 A | * | 3/1996 | Iwasaki ....................... 375/344 |
| 5,694,389 A | * | 12/1997 | Seki et al. ................... 370/208 |
| 5,768,321 A | * | 6/1998 | Watanabe et al. ........... 375/344 |
| 5,917,864 A | * | 6/1999 | Asahara ....................... 375/344 |
| 6,058,150 A | * | 5/2000 | Ghosh ......................... 375/365 |
| 6,226,505 B1 | * | 5/2001 | Uda ............................. 455/255 |
| 6,240,146 B1 | * | 5/2001 | Stott et al. ................... 375/344 |

OTHER PUBLICATIONS

*Text For Sync Words in 1.2.4*, TIA Technical Subcommittee, TR45.3 Digital Cellular Standards, vol. 45.3.3/P9.12.20, Dec. 18–20, 1989.

* cited by examiner

*Primary Examiner*—Chi Pham
*Assistant Examiner*—Khanh C. Tran
(74) *Attorney, Agent, or Firm*—Brian M. Mancini

(57) ABSTRACT

A method (1400) of enabling automatic frequency control (AFC) concurrent with time alignment of information in a communication device includes a first step (1402) of providing a data stream to an AFC. A second step (1404) includes applying multiple frequency offsets to the data stream. The offsets are separated from each other by about $\pm 2\pi/2^m$ radians with m being the number of bits per symbol in the modulation system. A third step (1406) includes correlating each frequency offset signal with a predetermined symbol sequence until correlation is found. A fourth step (1408) includes coupling the correct data stream of the branch with the found correlation to an AFC logic circuit indicating AFC lock. A fifth step (1410) includes simultaneously supplying the correct data stream to the communication device along with the fourth step (1408) such that time alignment can take place concurrently with AFC in the communication device.

28 Claims, 8 Drawing Sheets

| UNIQUE WORD NUMBER AND BIT LENGTH || ACCUMULATED PHASE ERROR PER SYMBOL (RADIANS) |||
|---|---|---|---|---|
| UNIQUE WORD | 20 BITS | $-\pi/2$ | $+\pi/2$ | $\pm\pi$ |
| 1 | 0x87a4b | 0xE1F2D | 0x1E0D2 | 0x785B4 |
| 2 | 0x9d236 | 0xC4B93 | 0x3B46C | 0x62DC9 |
| 3 | 0x81d75 | 0xE8410 | 0x17BEF | 0x7E28A |
| 4 | 0xa94ea | 0xFC27F | 0x03D80 | 0x56B15 |
| 5 | 0x5164c | 0x08326 | 0xF7CD9 | 0xAE9B3 |
| 6 | 0x4d9de | 0x24C47 | 0xDB3B8 | 0xB2621 |
| 7 | 0x31baf | 0x98DF5 | 0x6720A | 0xCE450 |
| 8 | 0x1e56f | 0x87035 | 0x78FCA | 0xE1A90 |
| 9 | 0xe712c | 0x718B6 | 0x8E749 | 0x18ED3 |
| 10 | 0xfbc1f | 0x5D685 | 0xA297A | 0x043E0 |
| 11 | 0x8279e | 0xEB1C7 | 0x14E38 | 0x7D861 |
| 12 | 0x98908 | 0xCECAE | 0x31351 | 0x676F7 |

| RAW DATA IN A SINGLE PDC RECEPTION SLOT (280 BITS) | RAW HEXADECIMAL REPRESENTATION | UNALIASED HEX REPRESENTATION | |
|---|---|---|---|
| SYMBOLS WITH NO PHASE SHIFT | | | |
| 1010101100000001100011001010 | 0xab018ca | 0xab018ca | |
| 0011010011111111101000101000 | 0x34ffa28 | 0x34ffa28 | |
| 0111010110010110011110001111 | 0x759678f | 0x759678f | |
| 1111101000001101111011011101 | 0xfa0dedd | 0xfa0dedd | |
| 1000011000011101011101010100 | 0x86075d4 | 0x86075d4 | NO ERRORS |
| 0000011011010111110010101000 | 0x06d7d54 | 0x06d7d54 | |
| 0000101000010111100101111011 | 0x0a1797b | 0x0a1797b | |
| 0000001110011101001001111010 | 0x039d27a | 0x039d27a | |
| 0010101000100100101100111000 | 0x2a24b38 | 0x2a24b38 | |
| 0101100101011001101000011101 | 0x5959a1d | 0x5959a1d | |
| -π/2 SHIFTED SYMBOLS | | | |
| 1111110110101000111001101111 | 0xfda8e6f | 0xab018ca | |
| 1001001001010101111110111110 | 0x9255fbe | 0x34ffa28 | |
| 0001000011000011000111100101 | 0x10c31e5 | 0x759678f | |
| 0101111110100100011101000100 | 0x5fa4744 | 0xfa0dedd | |
| 1110001110100001000001000010 | 0xe3a1042 | 0x86075d4 | NO ERRORS |
| 1010001110000010100000000010 | 0xa341402 | 0x06d7d54 | |
| 1010111110000001110000011101 | 0xaf81c1d | 0x0a1797b | |
| 1010100111000100101100011111 | 0xa9c4b1f | 0x039d27a | |
| 1011111110110010110110011110 | 0xbfb2d9e | 0x2a24b38 | |
| 0000110000011001111100000100 | 0x0c0cf84 | 0x5959a1d | |
| +π/2 SHIFTED SYMBOLS | | | |
| 0000001001010111000100010000 | 0x0257110 | 0xab0188a | 1 |
| 0110110110101010000001000001 | 0x6daa041 | 0x34ffa28 | |
| 1110111100111100111000011010 | 0xef3ce1a | 0x759678f | |
| 1010000010110111000101111011 | 0xa05b8bb | 0xfa0dedd | |
| 0001110001011100111110111101 | 0x1c5cfbd | 0x86065d4 | 1 |
| 0101110010111110101111111101 | 0x5cbebfd | 0x06d7d54 | |
| 0101000001111111000111111000010 | 0x507e3e2 | 0x0a1797b | |
| 0101011000110110100111000000 | 0x563b4e0 | 0x039d27a | 2 ERRORS |
| 0100000000100110100100110001 | 0x404d261 | 0x2a24b38 | 0.71% BER |
| 1111001111111001100001111011 | 0xf3f307b | 0x5959a1d | |
| ±π SHIFTED SYMBOLS | | | |
| 0101010011110100011101110101 | 0x54f4775 | 0xab0b88a | 3 |
| 0100100100000000010111010101 | 0x49005d5 | 0xb6ffa2a | 3 |
| 1000101000101000100001110000 | 0x8a28870 | 0x75d778f | 2 |
| 0000010111110010000000100010 | 0x05f2022 | 0xfa0dfdd | 1 |
| 0101000111111000101000100001 | 0x51f8a21 | 0xae075de | 4 |
| 0111100100101000001010101011 | 0x79282ab | 0x86d7d54 | 3 |
| 1111010111101000001010000100 | 0xf5e8284 | 0x0a17d7b | 1 |
| 1111110000100010110110000101 | 0xfc22b85 | 0x03dd27a | 1 | 23 ERRORS |
| 1101010111011011010001000101 | 0xd5db445 | 0x2a24bba | 2 | 8.2% BER |
| 1010001010100010010101100010 | 0xa2a2562 | 0x5d5da9d | 3 |

*FIG.7*

METHOD AND APPARATUS FOR CONCURRENT SYNCHRONIZATION AND IMPROVED AUTOMATIC FREQUENCY CONTROL IN A COMMUNICATION DEVICE

FIELD OF THE INVENTION

The present invention generally relates to communication devices, and more particularly to a method and apparatus for a receiver to acquire a digital signal.

BACKGROUND OF THE INVENTION

The present invention relates generally to frequency control systems and, more particularly, to a frequency control system operative in a digital receiver. The discontinuous transmission of signals can be due several events including start-up of the radiotelephone, dropping and re-establishing a call, and saving power during an idle state, among others.

Conventional frequency control circuitry controls frequency drift of the receiver by comparing zero-crossings of an intermediate frequency (IF) with an appropriately scaled version of a radio's reference oscillator. The simplest form of this type of circuitry requires a signal to be applied continuously to the frequency control circuitry for proper operation thereof. Accordingly, frequency drift can occur in a receiver that is only intermittently powered to receive a signal. Moreover, output transitions from this circuit become very slow as the frequency error approaches zero. Therefore, the performance of this type of circuitry is clearly unacceptable if fast automatic frequency control (AFC) convergence is necessary.

Receivers constructed to receive digital signals oftentimes include decision-directed detectors. M-ary PSK modulation decision-directed detectors accumulate phase shift per symbol information. Such decision-directed devices are capable of providing a frequency control signal having a fast response. However, such frequency control signals generated by the decision-directed devices are accurate only when the frequency error of the reference oscillator viewed as accumulated phase error is small with respect to the phase decision space of the particular modulation. If the frequency error is large enough to cause the device to make an incorrect decision on the symbol received, then the device will direct the AFC algorithm to a false solution point. For example, the previously described conventional frequency control circuitry is operable when the frequency errors are within the reception bandwidth of the receiver, while conventional decision-directed devices are operable over frequency errors that are a fraction of the reception bandwidth. An example of this limitation is the QPSK modulation signal used in PDC which limits the useful range to only approximately ±2.6 kilohertz. This relationship depends upon the M-ary PSK nature of the modulation. A BPSK (2-ary PSK) signal would have been ±5.2 kHz while a 8-PSK signal would be ±1.3 kHz. BTW QAM signals are also within the capabilities of this technique.

The descriptions above show the restrictions and limitations on existing frequency control circuits and detectors. The associated complications make the AFC algorithm cumbersome and consequently, difficult to make robust. The lack of robustness has been demonstrated by forcing "bad" signal conditions and observing that AFC does not always recover when "good" signal conditions are restored.

Other problems occur when the received signal does not have uniform spectral density across the IF bandwidth. By its nature, the frequency detector steers the AFC algorithm such that the signal is "centered" in the IF passband. In this context, "centered" refers to equal signal power above and below the center of the IF passband. Consequently, problems may occur when received signals do not have uniform spectral density.

Further, all AFC algorithms can have a limited range of convergence that may not reliably lock on to a $\pi/4$ DQPSK or 8-PSK signal (such as is proposed in the next generation EIA/TIA standard 136A), which becomes further exacerbated at higher operating frequencies such as in the 1900 MHz frequency band. Because of this limited range of operability, currently known frequency control circuitry utilizing the decision-directed device cannot be utilized when the frequency differences between the signal transmitted to the receiver and the oscillation frequency of a receiver-oscillator is significant, such as immediately subsequent to initial powering of the receiver prior to effectuation of frequency control. Further, once frequency control is established the digital information in the mobile radiotelephone must be frame synchronized with its associated fixed-site base station.

Frame synchronization in today's digital cellular telephones cannot take place until the frequency error of the reference oscillator is made sufficiently small to provide an unaliased unique (sync) word within data frames of incoming transmissions, which implies that an AFC algorithm must first reduce subscriber unit frequency error so that no symbol aliasing occurs. Because the AFC acquisition process is relatively slow compared to the data frame acquisition process, any useful information (after acquiring synchronization) may be held off for a significant length of time.

In a Time Division Multiple Access (TDMA) system, such as the Personal Digital Cellular (PDC) system in Japan, a subscriber unit must be capable of quickly synchronizing itself with the base station. Synchronization is required so that the subscriber unit can transmit and receive data during appropriate time slots. Frame synchronization is achieved by the successful reception of a unique word (also called "sync word" in the PDC system) for several consecutive frames. During the synchronization process, received data is correlated with a predefined unique word, and if correlation metric is greater than some threshold value, the assumption is made that the unique word has been received. Also, since the unique word within a frame occurs periodically, the subscriber unit has a time reference from which important TDMA and call processing events can be based.

However, in the presence of large frequency errors, the bit stream from a decision directed detector (including the unique word) can be 'aliased'. For example, in the well-known quadrature phase shift keying (QPSK) demodulation system, a received signal can be represented as an in-phase (I) signal and a quadrature signal (Q), which together represent a two-bit symbol having one of four states, 00, 01, 10 and 11. However, if the received signal accumulates sufficient phase shift due to frequency error, the symbol decision is incorrectly made.

FIG. 1 shows how symbol data, in the PDC system for instance, is aliased as a function of accumulated phase error per symbol. For example, if a true QPSK symbol of 00 accumulates about $+\pi/2$ radians of phase error (or within the phase space range of greater than $+\pi/4$ to less than $+3\pi/4$) during a symbol time, then it will be incorrectly decoded as the 01 symbol. Note that symbol aliasing is actually periodic with frequency error, i.e. QPSK symbol aliases repeat every integer multiple of $2\pi$ radians phase error per symbol. It is not possible to distinguish between aliases caused by +π and −π radians phase error per symbol. Current receiver implementations can ignore larger errors, i.e. frequency errors which produce phase errors per symbol larger than π radians, indicate some form of hardware failure and need not be addressed.

What is needed is a solution that shortens the time needed to acquire data frame synchronization. Such a solution will remove the following problems with the existing AFC/frame synchronization implementation: (1) slow response time of AFC convergence time; (2) incorrect response to accumulated phase error; and (3) slow signal processing start-up due to serial processing of AFC convergence followed by frame synchronization.

Accordingly, what is needed is a method and apparatus to shorten frame synchronization acquisition in a digital communication device when a signal is transmitted thereto in intermittent bursts even where frequency differences between such transmitted signal and the receiver-oscillator frequency is significant. It is also desirable to provide a solution that increases the AFC range of convergence without significantly adding to costs.

BRIEF DESCRIPTION OF THE DRAWINGS

FIG. 7 shows tabular experimental data showing the output of the data re-mapper of FIG. 2;

DETAILED DESCRIPTION OF THE INVENTION

The present invention provides a method and apparatus for concurrent time alignment or frame synchronization and automatic frequency control with an expanded range of convergence in a digital communication device. The present invention when implemented in a QPSK modulation system, provides up to five times or more of the AFC range of convergence over the prior art without significantly adding to the cost to the radiotelephone. Other implementations may have varying AFC range advantages. The present invention provides the advantage of quick frame synchronization acquisition by running AFC and frame synchronization processes concurrently even in the presence of frequency errors large enough to cause symbol aliasing.

Figure 2:
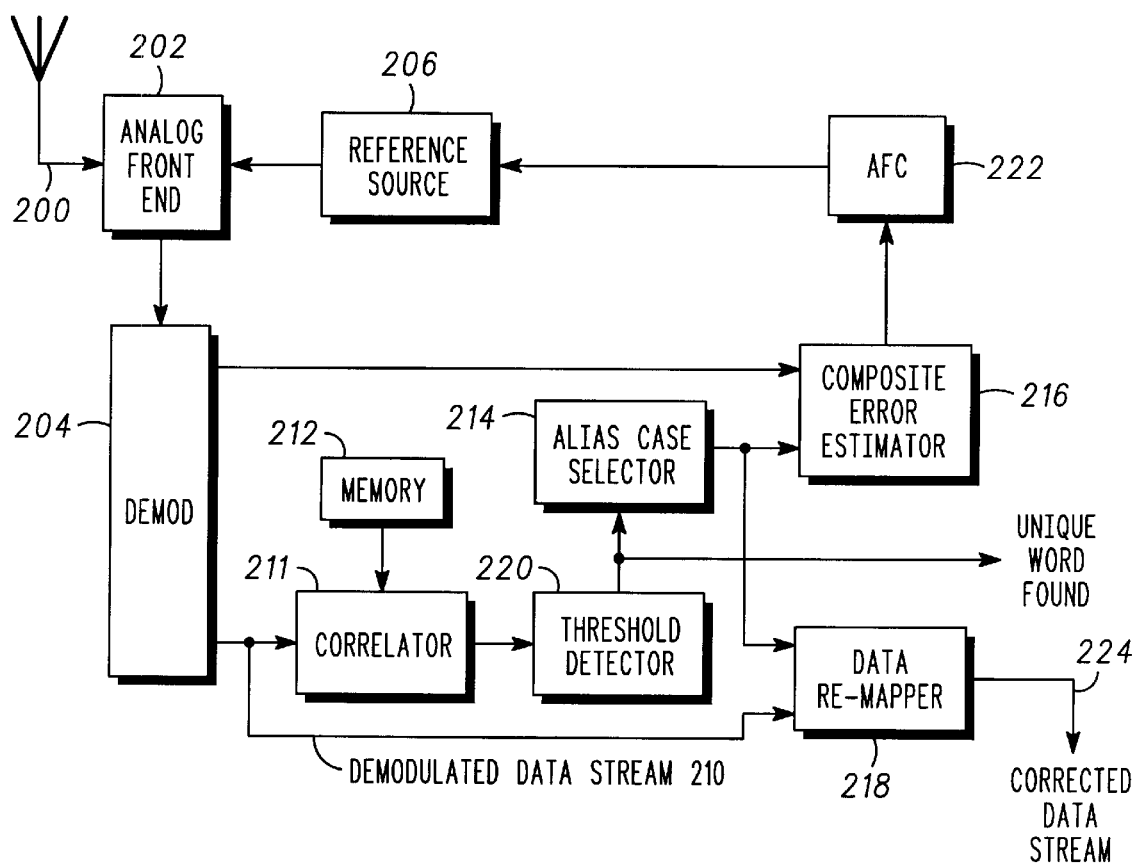
FIG. 2 shows a simplified block diagram of a first embodiment of the present invention.

FIG. 2 is a block diagram of a receiver portion of a digital communication device, in accordance with a first embodiment of the present invention. The receiver includes an antenna 200 for receiving incoming signals. The incoming signals from the antenna 200 are processed through an analog front end 202 of the communication device, using techniques known in the art. Typically, the analog front end provides a first down-conversion to an intermediate frequency (IF), which is then applied to a demodulator 204. The demodulator 204 of the current embodiment demodulates QPSK modulation and yields a baseband demodulated digital data stream 210 from the incoming signals using processes known in the art. Equivalent demodulators can be constructed for the various modulation methods with out loss of generality for this invention.

The demodulator 204 also includes a frequency control circuit for minimizing the frequency error of a reference source 206 of the receiver in a frequency relationship with the frequency of the incoming signals. The reference source preferably includes a crystal oscillator signal applied to a frequency synthesizer that is used to generate one or more local oscillator frequencies used for frequency down-conversion of the incoming signals in the receiver. The frequency control circuit is operable even when the receiver portion of the communication device is operational only during the intermittent time periods. The frequency control circuit of the demodulator 204 can include circuit elements analogous to elements comprising a frequency detector and a decision-directed demodulator. Such a circuit is detailed in U.S. Pat. No. 5,280,644 to Vannatta et al., which is hereby incorporated by reference.

Figures 3, 8:
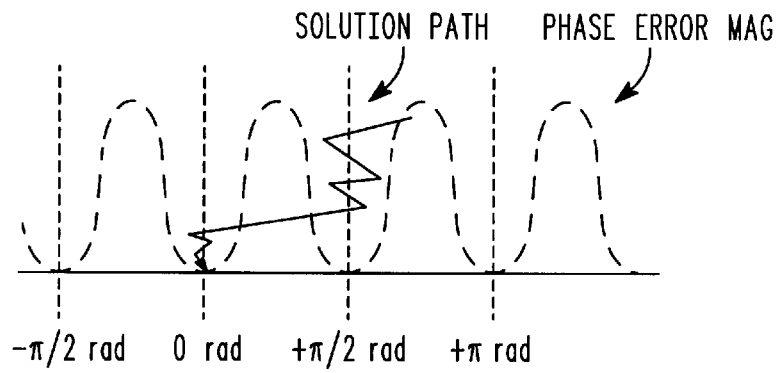
FIG. 3 shows tabular data indicating a portion of the contents of the memory of FIG. 2.
FIG. 8 shows a graphical representation of frequency tuning provided in accordance with the present invention.

The frequency control circuit of the demodulator 204 is operative to compare and determine frequency differences between the incoming signals applied thereto and the reference source 206 so as to provide a frequency error signal. The demodulator 204 maintains an internal representation of frequency error and symbol phase error. It is preferred that the frequency error of the internal representation has been at least corrected to an integer multiple of π/2 frequency error, which occurs at phase error minima (as represented in FIG. 8). This internal representation may further aid in minimizing the symbol decision error rate of demodulated data stream 210. An indication of such frequency error is generated on line 208 (and applied to a composite error estimator 216) and is useful for frequency error correction of any magnitude when used in conjunction with the output of an alias case selector 214 as will be explained below.

The demodulated data stream 210 is further processed by the communication device to obtain useful information. However, the data stream 210 may contain mapping errors when the accumulated phase error is greater than ±π/4 radians per symbol (in a QPSK system) which must be corrected before being further processed in higher layers of the communication device. A mapping (symbol) error occurs when the accumulated phase error over one symbol time is sufficient to cause an alias. In general, a symbol error occurs wherever a symbol is translated by a phase shifts of greater than about ±π/$2_m$ radians per symbol where m equals the number of bits per symbol in the specific modulation format being used.

If one considers the decision space for ±π/4 QPSK, the "ideal" points in the constellation at symbol decision times are in the middle of each decision region. Since each decision region occupies one-fourth of the total decision space, the "width" of each region is π/2. Therefore, an incorrect decision will occur when accumulated phase errors are moved from the ideal point by more than ±π/4 radians, ±3π/4 radians, etc. For example, given a phase shift of +5π/16, the symbol will be decoded as that of the +π/2 symbol, 10. In an 8-PSK system (three bits per symbol, m=3), mapping errors can occur when the accumulated phase error is greater than ±π/8 radians per symbol. In a BPSK format (one bit per symbol, m=1), system mapping errors can occur when the accumulated phase error is greater than ±π/2 radians per symbol.

In addition, the receiver portion of the communication device must be frame synchronized with the data stream 210 before further processing. When the data stream 210 comprises a framed signal for example, it can only be processed accurately when the receiver portion of communication device is frame synchronized with the framed signal transmitted thereto. Once frequency control has initially been established and the receiver portion becomes synchronized with the signal transmitted thereto, significant portions of the receiver portion of the communication device may be turned-off and only intermittently powered during the intermittent time periods during which the TDMA signal is received.

Figure 1:
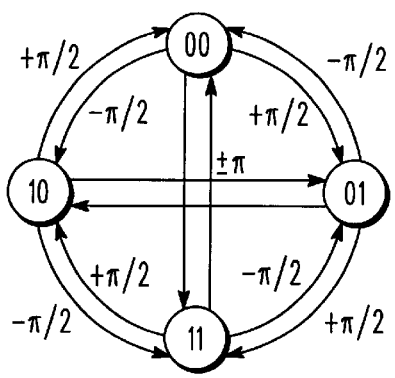
FIG. 1 shows a simplified state diagram of the aliasing of QPSK symbol data with accumulated phase error.

The demodulated binary data stream 210 output from the demodulator 204. Framing and formatting of the data stream contains words of a predetermined length. These words are made up of many symbols composed of at least two bits each, as is known in the art. For QPSK modulation, symbols may take on a representation of one of four possible two-bit mappings of true data: 00, 01, 10, 11. However, these symbols may be in error if they have experienced a phase shift (as represented in FIG. 1). Fortunately, in a system such as the PDC/TDMA system, unique words have been pre-defined such that the communication device can recognize, remap and synchronize to an incoming signal.

A memory 212 is provided that contains a list unique words each comprising a predefined symbol sequence in a system standard (such as are used in known TDMA and CDMA standards, for example). The memory 212 can also contain associated aliases of the unique words or the aliases can be generated from the unique words. In either case the aliases are realizable from the unique words. These unique words are used to correlate against the corresponding unique words in the incoming signal transmitted to the receiver. However, the demodulated data stream will be aliased if the incoming signal has substantial frequency error following the down-conversion process. As a result of such aliasing, the data stream output from the demodulator will be unrecognizable by the communication device.

The present invention solves this problem by not only using the predefined unique words to correlate against the corresponding unique words in the incoming signal transmitted to the receiver, but also to store possible associated aliases of the unique words in the memory to detect if the corresponding unique words in the incoming signal transmitted to the receiver has also been aliased due to excess frequency error. In this way, the present invention allows the communication device to operate over a much larger range of frequency error than in the prior art.

FIG. 3 shows a list of twelve unique words (second column) and phase shifted aliases (columns 3–5) that could occur in transmissions with large frequency error. The particular group of words shown incorporates twelve unique, 20-bit, hexadecimal words as may be used in a TDMA communication system, for example. However, it should be recognized that various other numbers, lengths, groupings and sizes of unique words can be used equally well, depending on the particular communication system. The unique words of column two are chosen for their particular property of being pseudo-orthogonal. It should be recognized that aliased representations of the unique words in columns three through five preserve this desirable property of substantial orthogonality. In the third column aliased unique words are shown wherein each symbol of the word has been phase shifted by −π/2 radians per symbol (reference FIG. 1) for a QPSK format. Similarly, columns 4–5 show aliasing of +π/2 and ±π radians per symbol, respectively. The aliases for +π error and −π error are identical.

Referring back to FIG. 2, the demodulated data stream 210 from the demodulator 204 is coupled to a correlator 211 (and to a data re-mapper 218 to be subsequently corrected). The memory 212 is coupled to the correlator 211 and supplies the list of unique words and associated aliases of the unique words (shown in FIG. 3) to be correlated to the demodulated data stream 210. Alternately, the list of unique words may be remapped to form a larger list of unique words and aliased unique words. The correlator 211 correlates the data with a subset of the unique words and their associated word aliases supplied from the memory 212. The prescribed subset is determined by higher layer control to determine which slot of a frame is targeted in time. When a unique word or unique word alias exceeds the threshold set in threshold detector 220, the output of threshold detector 220 is passed to an input of the alias case selector 214 and also to further processing as indicated in FIG. 2 as Unique word found.

The alias case selector 214 determines which unique word or alias correlated to a segment of data stream 210 and outputs the corresponding phase shift (alias error) present in the data stream 210, indicating which of the unique words and associated aliases of the unique words provided the found correlation, to the data re-mapper 218 (and also to the composite error estimator 216) which is coupled to the alias case selector 214. For example, if unique word 0x87a4b correlated to the data stream then zero phase shift is indicated. If alias word 0x1E0D2 indicated a high correlation to a segment of the data stream, then +π/2 is indicated. In a preferred embodiment, the QPSK formatted reception signal is demodulated into a data stream having symbols of two bits each, and the alias case selector 214 indicates one of four possible phase-shift states of the true data: zero shift, +π/2 shift, −π/2 shift and ±π shift. Other modulation formats such as BPSK, 8-PSK, or QAM have similar relationships and a control system can be made to take advantage of their formatting. In these formats, the alias case selector provide the number of phase-shift states corresponding to the number of possible symbols in the format.

Given that all digital radio receivers need a unique word or words for frame synchronization, the properties of the unique words and their associated aliases were studied to determine if any false correlations could occur. A correlation metric over two downlink frames of data was tested. The simulated correlator used is actually monitoring for correlation for all forty-eight of the 20-bit words and their aliases (shown in FIG. 3). The bit-sum metric calculation is $$C(n) = \frac{\sum_{i=1}^{20} 2 \cdot (b_{n+i} \oplus w_i) - 1}{20}$$

where $b_n$ is the $n^{th}$ bit in the binary data stream $w_i$ is the $i^{th}$ bit in the unique word Eq. (1)

Figure 4:
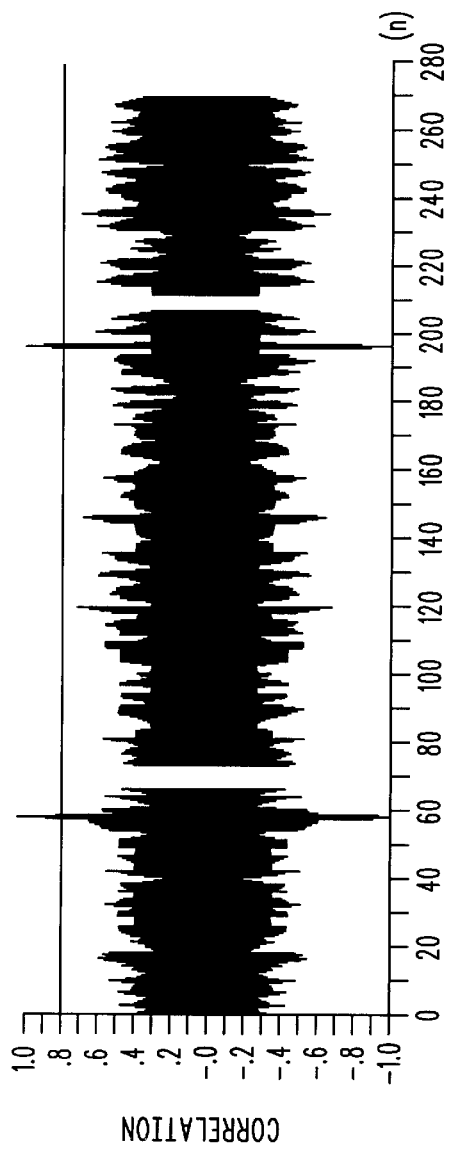
FIG. 4 shows a graphical representation of the bit-wise correlation of a bit-sum function provided by the correlator of FIG. 2.

The results of this correlation are shown in FIG. 4. As can be seen, a threshold detector 220 detects two successive correlation peaks, C(n)=1 at n=58 and n=198, correspond to the two times when that portion of the bit stream, $b_n$, passing through the correlator contains the particular unique word in the superframe structure of the communication system. The index count of 198−58 indicates that 140 symbols (280 bits) of time have elapsed between correlation peaks. The peaks C(n)=−1 at n=58 and n=198 are from the correlator finding the aliased synchronization words at ±π radians/symbol error. As can be seen, choosing a predetermined threshold level of 0.8 in the threshold detector is sufficient to provide accurate correlation indications that exceed that threshold level in the PDC/TDMA system, for example.

If the correlation metric is changed to an equation similar to that used in the TIA TR45.3 Technical Subcommittee of Digital Cellular Standards (implementing interim standards IS54 or IS136), additional information can be derived, and can further reduce the proposed correlator's complexity. The complex correlation metric used in TR45.3.3 P9.12.20 provides simultaneous information about all aliases as opposed to the two of the four possible word representations in the above bit-sum method. The correlation metric used is $$\hat{C} = \sum_{i=1 \text{step} 2}^{20} \{map\langle b_n, b_{n+1}\rangle \times (map\langle w_n, w_{n+1}\rangle)^*\}$$

where map< > is $$\begin{pmatrix} 00 \\ 01 \\ 10 \\ 11 \end{pmatrix} \Leftrightarrow \begin{pmatrix} 1+j0 \\ 0+j1 \\ -1+j0 \\ 0-j1 \end{pmatrix}$$

and ( )* indicates conjugation

Eq. (2)

Figure 5:
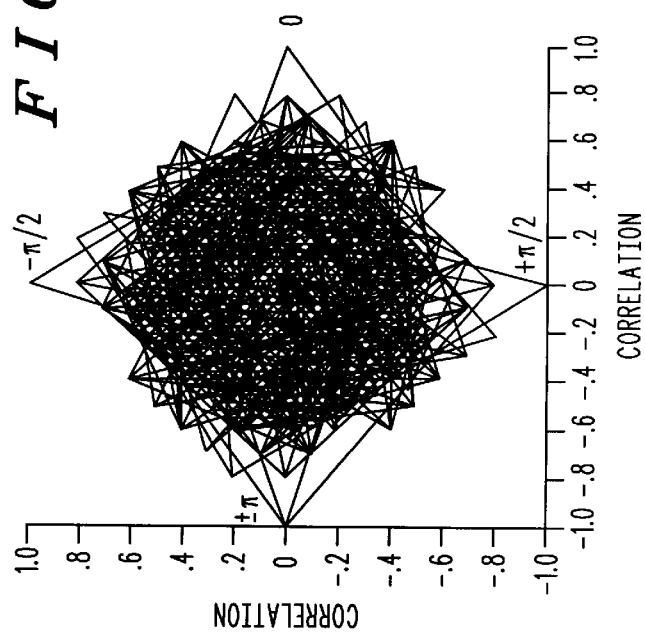
FIG. 5 shows a graphical representation of a complex correlation function using bit-wise correlation in the correlator of FIG. 2.
Figure 9:
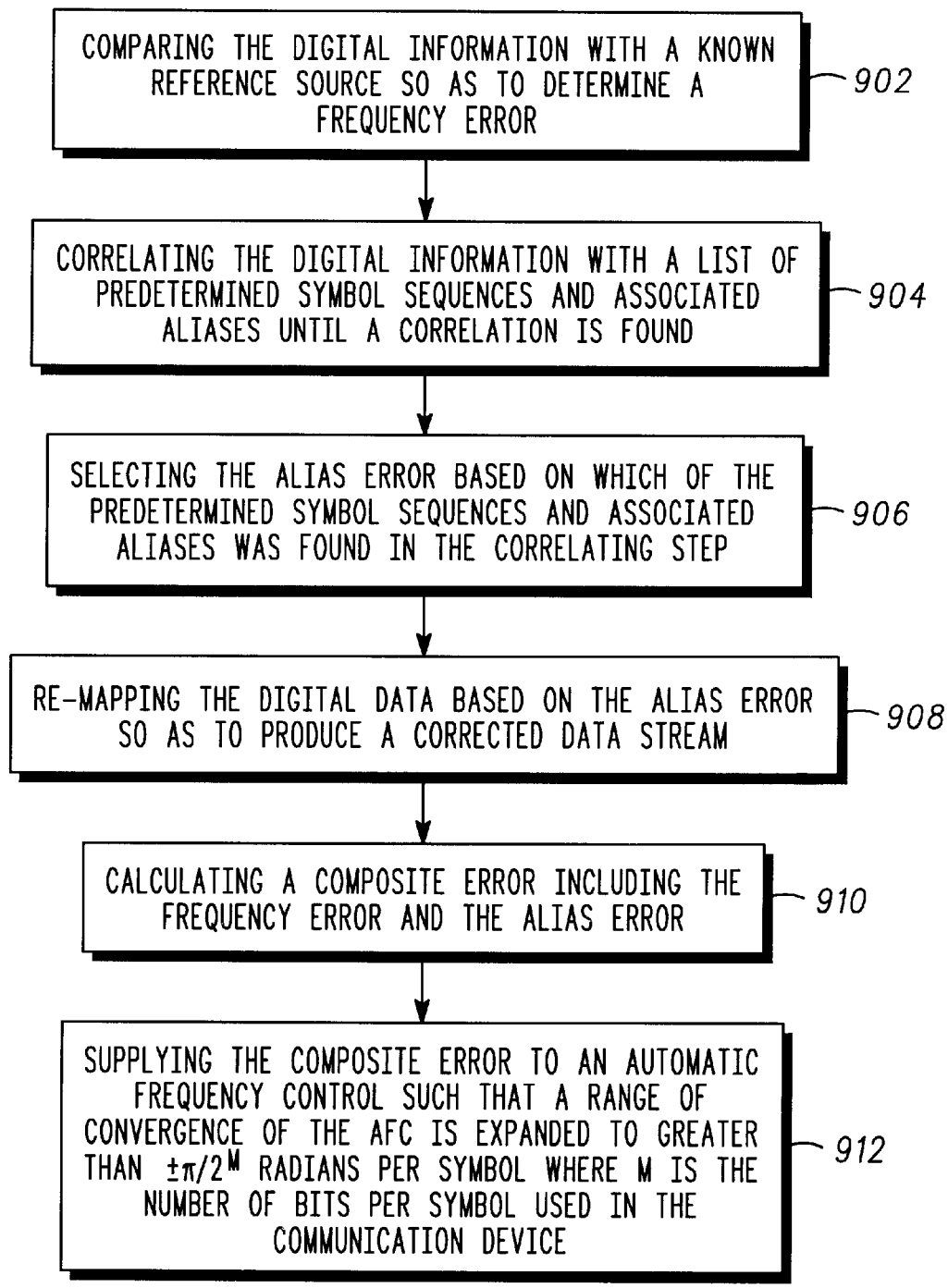
FIG. 9 shows a flow diagram listing the methods steps of the preferred embodiment of the present invention.

The results of this bit-wise complex correlation are shown in FIG. 5 and represent the passing of two frames of data through Equation 2. The five peaks correspond to five word aliases. As can be seen, choosing a threshold of 0.8 in this type of correlation metric is also sufficient to provide accurate correlation indications in the PDC/TDMA system, for example.

Figure 6:
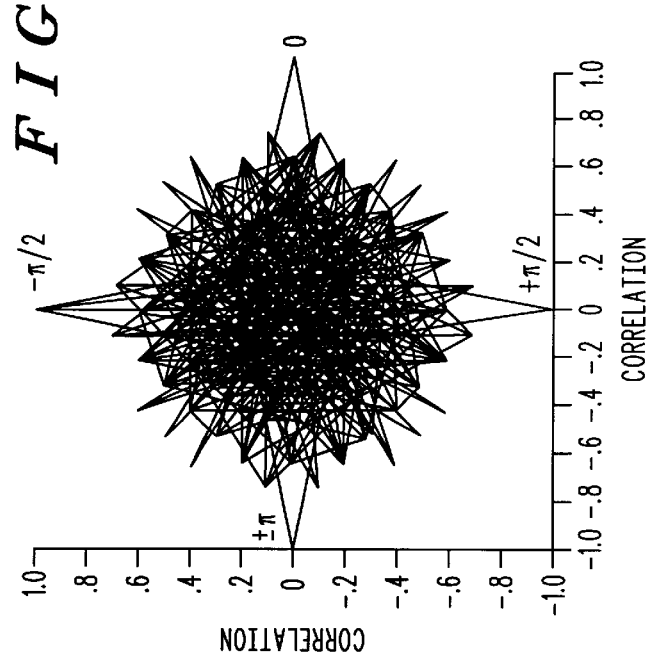
FIG. 6 shows a graphical representation of a complex correlation function using symbol-wise correlation in the correlator of FIG. 2.

If Equation 1 or Equation 2 is utilized to perform a symbol-wise correlation instead of a bit-wise correlation, further improvements can be obtained. The results of a symbol-wise complex correlation are shown in FIG. 6. As can be seen, choosing a threshold of only 0.7 in this type of correlation metric is also sufficient to provide accurate correlation indications in the PDC/TDMA system, for example. Therefore, using a symbol-wise complex correlation is preferred in the present invention.

The data re-mapper 218 of FIG. 2 uses the output of alias case selector 214 to re-map the input data stream, yielding a corrected data stream in accordance with the indicated alias error from the alias case selector, as shown in FIG. 7. Re-mapping corrects the data stream in the sense that symbol aliasing is removed. For example, the first and second columns of FIG. 7 show raw binary and hexadecimal representations of information in the data stream, respectively. If zero phase shift is indicated by the alias case selector, then the data is output from the data re-mapper 218 unchanged. However, if −π/2 phase shift is indicated then the data re-mapper 218 re-maps (unaliases) all the symbols to output a corrected data stream 224 that can be properly recognized and decoded by the communication device.

FIG. 7 shows experimental results of the present invention. As can be seen +π/2 and −π/2 data matches the true data with no excess phase shift very closely (to an acceptable bit error rate (BER)). The data with π radians excess phase shift per symbol has a larger number of bit errors. This is due to a significant portion of the π-shifted signal spectrum being distorted due to test conditions Referring back to FIG. 2, the frequency error 208 detected by the demodulator 204 is combined with the alias error output from the alias case selector 214 in the composite error estimator 216. The estimator 216 combines the frequency error and the alias error to apply to an AFC simultaneous with the data re-mapper supplying the corrected data stream to the communication device such that frame synchronization can take place concurrently with AFC in the communication device. The output from the estimator 216 can be fed to the AFC 222 and can be implemented in either software or hardware. In the prior art, the frequency error from the demodulator is used in the AFC to operatively alter the oscillation frequency of the reference source 206. Such alteration is sometimes referred to as warping of the oscillator, and the signal generated by the AFC is referred to as an oscillator warp signal.

At such time, the AFC generates an output signal to warp the frequency of the reference source 206 to match that of the incoming signals received by the receiver. For example, an AFC pull-in range of ≦15 ppm may be necessary to account for the system variations. This corresponds to a frequency correction of ±12.2 kHz or ±1.16 Π radians/ symbol error in a typical 800 MHz cellular system, for example. This exceeds the capability of ±π/4 correction available in the prior art. In contrast, the present invention contributes the alias error output which, in conjunction with the frequency error 208 in the composite error estimator 216 extends the pull-in capability to greater than ±3π/4. The present invention allows the high speed nature of the decision directed detector be utilized of a wider range and thus helps speed AFC convergence to a correct frequency.

An example of the frequency error solution path for the proposed routine for the AFC is presented in FIG. 8 which illustrates how the additional alias error information is used from the alias case selector 214. In the prior art, the steering mechanism of the AFC drives the frequency to the nearest phase error magnitude minimum (e.g. to the nearest vertical dotted line in the figure) using techniques known in the art. Therefore, the prior art only provides a correction to within the nearest π/2 in phase. If a frequency error is larger than π/4 in phase, the AFC steers to an incorrect phase error minimum.

In contrast, the present invention uses the composite error estimator to steer the AFC to one of multiple solutions, i.e. in the present invention the AFC steers to the correct phase error magnitude minimum. The example of FIG. 8 shows the routine's solution temporarily converging on a false solution at +π/2. However, the output of the alias case selector provides additional aliasing error information, that information being which alias case was selected. At the point in time when the alias case selection is determined, the composite error estimator drives the AFC routine to output a large negative π/2 radians/symbol jump in frequency such that the AFC steers to the correct phase error magnitude minimum.

In particular, the frequency error provided by the digital demodulator is usable to provide fine error correction of less than about $\pm\pi/2_m$ radians of symbol phase error and the alias error is usable to provide coarse error correction of integer multiples of $\pm\pi/2^m$ radians of symbol phase error where m is the number of bits per symbol in the modulation format being used. In a QPSK format, the composite frequency estimator applies the alias error to the AFC such that a composite error is less than about π/4 radians per symbol from a phase null and applies the frequency error to the AFC such that a phase null is acquired at a correct symbol correlation. In this way the present invention provides up to five times or more of the error correction available in the prior art. Moreover, this is accomplished at an equal or faster speed. Furthermore, since the communication device already has corrected data on which to operate, synchronization can take place concurrently with AFC tuning, further improving signal acquisition.

It is expected that AFC routines in other products can be modified to account for system-specific or design-specific behaviors that arise when the phase error per symbol becomes large enough to cause repeated data aliases to occur. Under most conditions, however, the correlation result alone is sufficient for an AFC algorithm to steer the received signal so that unaliased data is received. Therefore, some intelligence can be built into an AFC algorithm to resolve repeated unique word aliases that occur.

Figure 10:
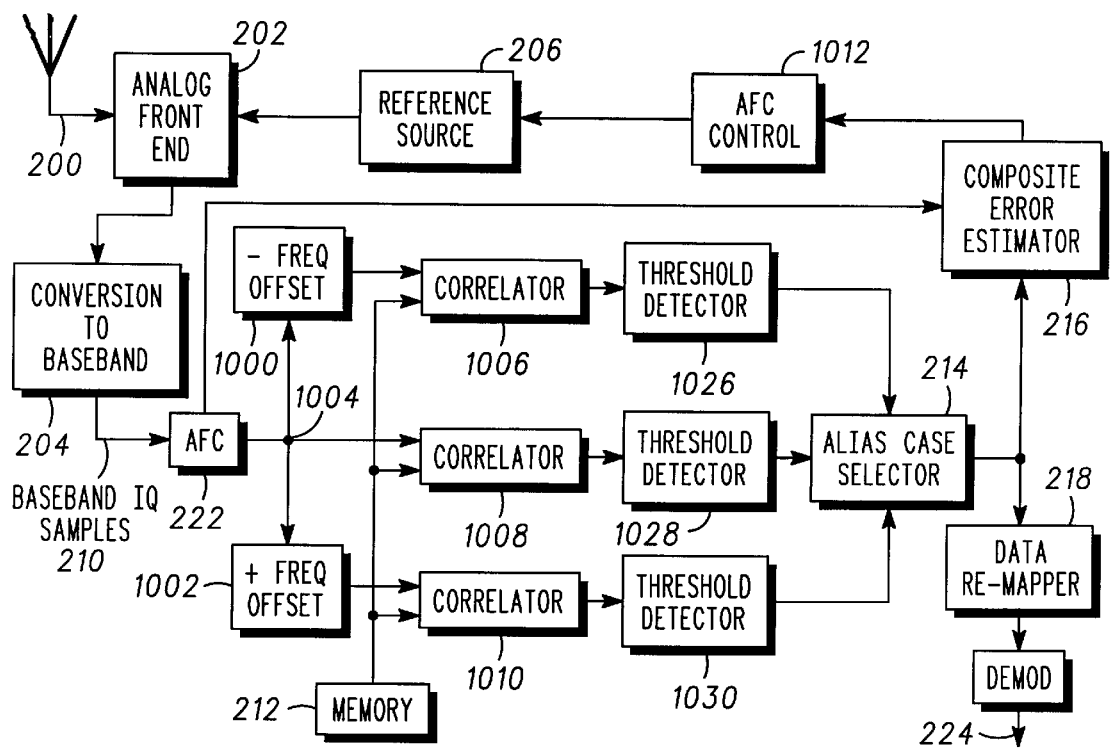
FIG. 10 shows a simplified block diagram of a preferred embodiment of the present invention.

FIG. 10 shows a preferred embodiment of the present invention that is also usable to expand the region of convergence (ROC) of an AFC. This embodiment has many of the same features of the preferred embodiment of FIG. 2, which have been included in FIG. 10 and whose features and operation are hereby incorporated by reference. In this embodiment, the baseband IQ samples of block 204 are sent to AFC 222. For a π/4 DQPSK system, the steering mechanism of the AFC 222 drives the frequency error to the nearest π/2 phase error magnitude minimum (e.g. to the nearest dotted line in the FIG. 8) using techniques known in the art. For a combined π/4 DQPSK and 8-PSK system, the AFC 222 drives the frequency error to the nearest π/4 phase error magnitude minimum. However, as phase errors larger than these can occur, this embodiment uses a bank of frequency offset blocks 1000, 1002. Each offset block 1000, 1002, excluding the main (no offset) branch 1004, adds a different frequency offset to the baseband signal from the AFC. Each of the branches of the offset blocks 1000, 1002, 1004 are subsequently processed with associated sync detector correlators 1006, 1008, 1010. The frequency offsets of each block 1000, 1002 are set equal to different nulls in the frequency error estimate (e.g. to dotted lines in FIG. 8) corresponding to π/4 phase error minimum. These offsets account for the case where the AFC algorithm converges to a null other than the correct null.

Each of the branches 1000, 1002, 1004 are subsequently processed with three sync detector correlators 1006, 1008, 1010, that each operate similarly as the correlator 211 of FIG. 2, in conjunction with a memory 212. In this way, where a frequency error in the radiotelephone produces larger than π/8 radians per symbol phase error, one of the correlators 1006, 1010 will still detect the proper sync word. Once the sync word is detected through a corresponding threshold detector (not shown) the current branch 1000, 1002, 1004 of the frequency bank indicating the detected sync word passes the correct data stream and a correlation found indication to an AFC logic circuit 1012. The AFC logic circuit 1012, once a lock is indicated, is able to warp the reference source 206 to the correct frequency. In between signal reception or transmission, the reference source 206 can be warped to the correct frequency to eliminate the frequency error at the source, and any further signal processing can be done through the main branch 1004 of the AFC. It is desirable to only warp the reference source 206 frequency between transceiver operations (i.e. not during data transmission or reception periods) so as not to disturb communications.

As shown, this embodiment increases the ROC to three times that available in the prior art. However, it should be recognized that more frequency offset stages/correlators could be added to increase the ROC up to five times or more that available in the prior art, but that problems such as IF bandwidth restrictions would limit the usefulness of any further additional offset stages. Once the error can be corrected for more than 2π radians of phase, the error can be corrected for all cases due to the periodicity of the solution. This embodiment does not use sync word aliases which saves memory 212 requirements.

Figure 12:
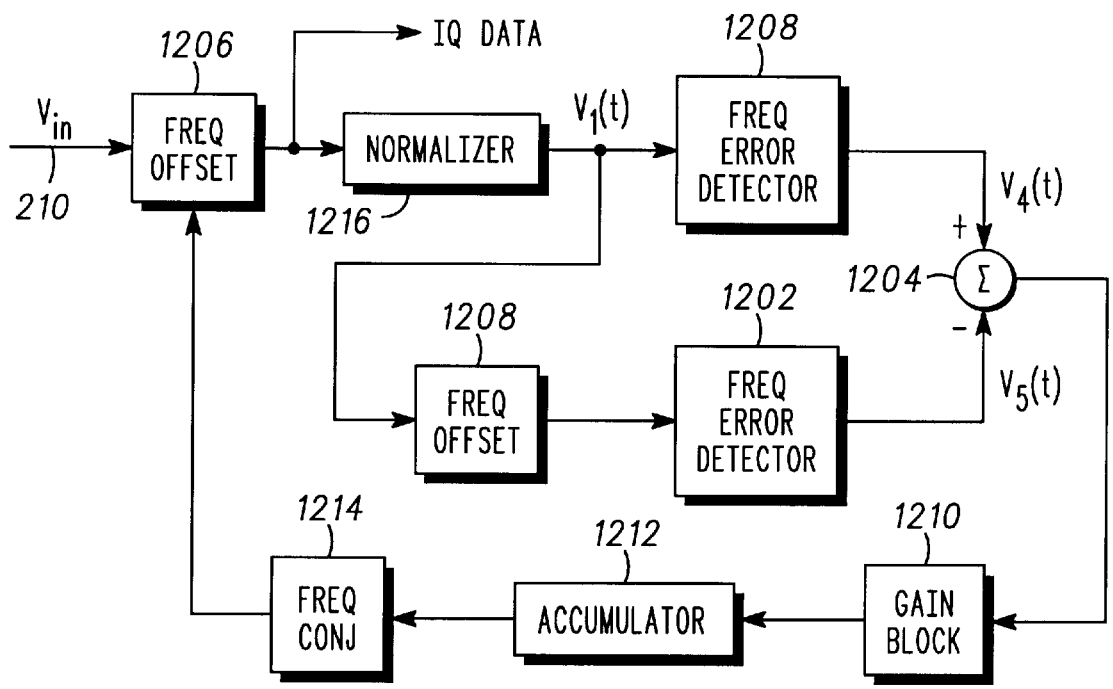
FIG. 12 shows a more detailed block diagram of the AFC block of the circuit of FIG. 10.

In more detail, FIG. 12 shows the AFC 222 of FIG. 10. The signal for the baseband IQ data stream 210 is applied to a first frequency offset block 1206 that will be described below. The signal, $V_1(t)$, is applied to a first frequency error detector 1200 where $V_1$ is $$V_1(t)=A\ \exp(j[\theta(t2)+\Delta\omega t2])$$

$$\Delta\omega=\omega_{err}-\omega_{det}$$

where θ(t2) is the absolute phase of the current symbol in radians, Δω is the residual frequency error in radians per second, $\omega^{err}$ is the frequency error of the AFC loop baseband signal input, $\omega_{det}$ is the detected frequency error, t2 is the current time, and A is the amplitude of the input signal. Preferably, the demodulated data stream 210 is normalized to make the frequency error calculation independent of the input signal amplitude (i.e. A=1).

Figure 13:
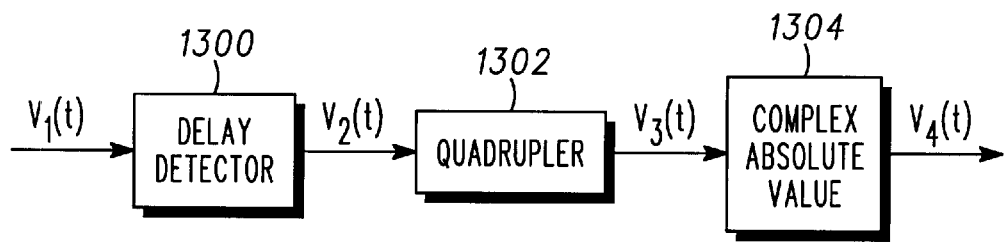
FIG. 13 shows a block diagram of one of the frequency detectors of the circuit of FIG. 12.
Figure 14:
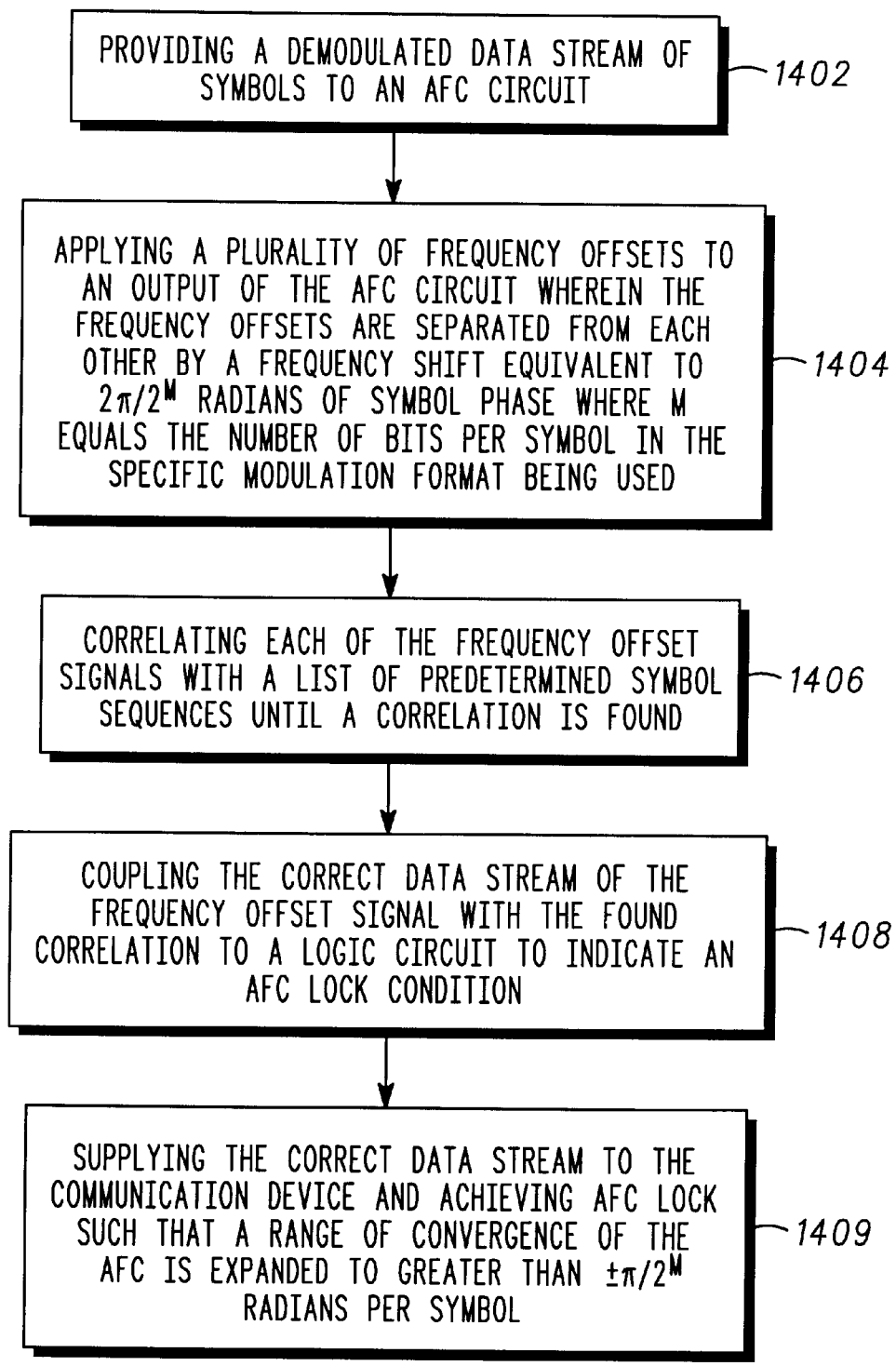
FIG. 14 shows a flow diagram listing the methods steps of the preferred embodiment of the present invention.

The purpose of the frequency error detectors 1200, 1202 is to estimate the residual frequency error magnitude of signal $V_1$. A block diagram of the frequency error detectors 1200, 1202 is shown in FIG. 13. The frequency detectors include a delay detector 1300, a quadrupler 1302, and a complex absolute value block 1304 coupled in series. The delay detector 1300 is used to determine the phase change between current and previous symbols. The output of the delay detector 1300 is $$V_2(t)=\exp(j[\theta(t2)-\theta(t1)+\Delta\omega(t2-t2)])$$

where t1 is the previous symbol time (t1=t2−symbol period). Specifically, the symbol period is 41.15 μs for IS-136 (24.3 kHz symbol rate).

The quadrupler 1302 is used to remove the modulation from the delay detector output. Removal of the modulation relies on the fact that the phase change for π/4 DQPSK and 8-PSK is a multiple of π/4. The output of the quadrupler is $$V_3(t) = \exp(j[4(\theta(t2) - \theta(t1)) + 4\Delta\omega(t2 - t1)])$$
$$= \pm\exp(j[4\Delta\omega(t2 - t1)])$$

or

-continued $$V_3(t) = \pm[\cos(4\Delta\omega(t2-t1)) + j\sin(4\Delta\omega(t2-t1))]$$

Since $$(\theta(t2) - \theta(t1)) = x\pi/4 \qquad x = 1, 3, 5, 7 \ (\pi/4 \text{ DQPSK})$$

$$x = 0, 1, 2 \ldots 7 \ (8\text{-PSK})$$

As shown the sign of the quadrupler output is unknown. For that reason, the absolute value of the quadrupler signal is used as the frequency error estimate. The frequency error estimate is $$V_4(t) = (|\cos(4\Delta\omega(t2-t1))|-1) \approx |\text{freq error}|$$

Note that only the real portion of the quadrupler output is used for the error estimate; the real portion is used to reduce the computational complexity and to produce phase minima nulls with more gradual slopes (reference FIG. 8) as compared to the imaginary portion.

Referring back to FIG. 12, the second frequency offset block 1208 uses a dither parameter to induce an artificial error in $V_1$ to determine the actual sign of the error estimate eliminating ambiguity. If the actual residual frequency error is $\Delta\omega_1$, the frequency offset, $\omega_d$, will produce an error estimate from the second frequency detector 1202 that is calculated as $$V_5(t) = -(|\cos(4(\Delta\omega-\omega_d)(t2-t1))|-1)$$

The difference between $V_4$ and $V_5$ is found in the block 1204. The integrator (blocks 1204, 1210, 1212) output is coupled back to the first frequency offset block 1206 so as to drive the residual frequency error of $V_1$ to a null. The detected frequency error is accumulated in block 1212 as $$\omega_{det} = \omega_{det} + \text{Gain}(V_4(t) - V_5(t))$$

where gain is applied at a gain block 1210. After $\omega_{det}$ is calculated and the new frequency offset is applied to $V_{in}$, the new residual frequency error of $V_1$ is $$\Delta\omega = \omega_{err} - \omega_{det} = \omega_{err} - (\omega_{det\ old} + \text{Gain}(V_4(t) - V_5(t)))$$

If the initial $\Delta\omega$ error produces a phase error less than $\pi/8$ radians per symbol (less than ±1518.75 Hz for IS-136), $\Delta\omega$ will converge to zero. However, if the initial $\Delta\omega$ error produces a phase error greater than $\pi/8$ radians per symbol, $\Delta\omega$ will converge to a different null. This relationship is $$(k-1)(\pi/8) < \Delta\omega_{init} < (k+1)(\pi/8)$$

$$\Delta\omega \text{ approaches}(\pi/4)k/2 \ k=0,\pm2,\pm4 \ldots$$

From this relationship, the AFC loop will only drive the residual baseband error, $\Delta\omega$, to zero if the baseband receive signal error, $\omega_{err}$, is between $\pm\pi/8$ which is a limited region of convergence (ROC). To increase the ROC, multiple frequency offset block branches 1000, 1002, 1004 as described for FIG. 10 above, are used to capture the correct phase null.

As shown in FIG. 10, the AFC loop is integrated with acquisition synchronization detector correlators. The synchronization detector correlates the frequency-error-corrected baseband signal to unique synchronization words. Alternatively, to reduce computational complexity, the branch frequency offset blocks 1000, 1002 could be eliminated and offsets added to the unique synchronization words in the memory 212. This is equivalent to aliasing the synchronization words in frequency with a frequency shift equal to the null frequencies at phase minima. The baseband data would then be correlated with the aliased synchronization words in the correlator 1008 to acquire synchronization.

Advantageously, finding synchronization can be used as a lock detector for the AFC loop. For example, if it is desired to set AFC lock when the AFC loop has converged to within ±200 Hz of the actual frequency error, the synchronization detector correlator threshold can be set such that the correlation peak will not exceed the threshold when the frequency error is above ±200 Hz. Thus, the sync word will not be detected until the frequency error is reduced below ±200 Hz. In this way, when the AFC loop converges to within ±200 Hz of the actual frequency error, the sync word will be detected and AFC lock is achieved.

Experiments were conducted using the above configuration of the preferred embodiment using IS-136. Results show that frequency lock and sync lock can be obtained in less than 25 milliseconds for input signals having a signal strength down to −105 dBm. This performance is as good as the prior art while convergence is achieved over a significantly wider frequency error range.

Figure 11:
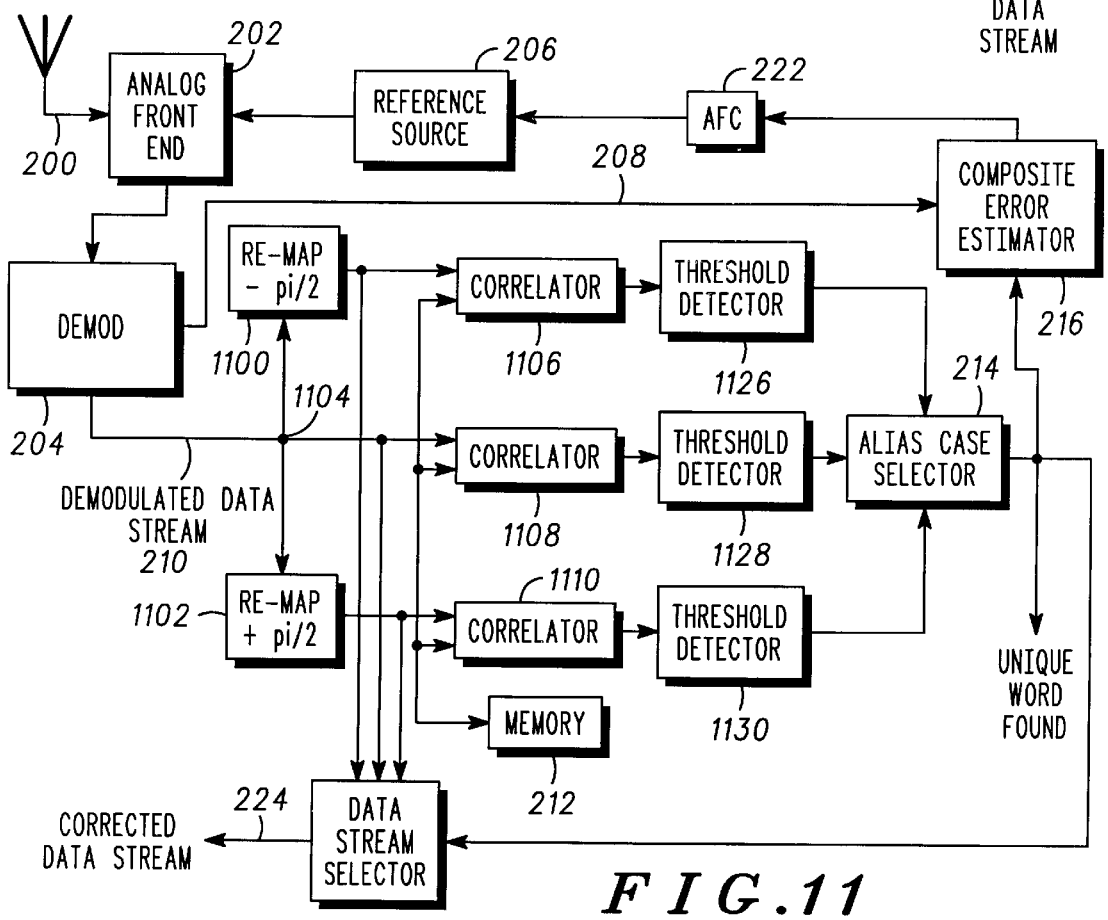
FIG. 11 shows a simplified block diagram of an alternate embodiment of the present invention.

FIG. 11 shows an alternate embodiment of the present invention that is also usable to expand the region of convergence (ROC) of an AFC. This embodiment has many of the same features of the preferred embodiment of FIG. 2, which have been included in FIG. 11 and whose features and operation are hereby incorporated by reference. In this embodiment, the correlator 211, alias case selector 214, and data re-mapper 218 have been replaced by a bank of re-mapping blocks and associated correlators. Each branch of the bank 1100, 1102, excluding the main (no re-mapping) branch 1104, re-maps the symbols in the demodulated data stream 210. Each of the branches 1100, 1102, 1104 are subsequently processed with sync detector correlators 1106, 1108, 1110. The re-mapping blocks 1100, 1102 are set equal to nulls (±π/4) radians per symbol, shown as dotted lines in FIG. 8). These re-mappings account for the case where the error is so large that the AFC algorithm converges to a null other than the correct null.

Each of the branches 1100, 1102, 1104 are subsequently processed with three sync detector correlators 1106, 1108, 1110, that each operate similarly as the correlator 211 (of FIG. 2) in conjunction with a memory 212. In this way, where a frequency error is larger than π/8 radians per symbol (to the nearest π/4 radians), one of the correlators 1106, 1110 will still detect the proper sync word. Once the sync word is detected through a corresponding threshold detector (not shown) the current branch 1100, 1102, 1104 of the frequency bank indicating the detected sync word is selected in the correlation buffer 1112 and processed normally in the radio telephone. In between signal reception or transmissions, the reference source 206 can be warped to the correct frequency to eliminate the frequency error at the source, and any further signal processing can be done through the main branch 1104. The composite error estimator 216 and AFC 222 operate as previously discussed for the preferred embodiment of FIG. 2

This alternate embodiment operates similarly to that of the preferred embodiment of FIG. 10, whose description is hereby incorporated by reference. In operation, this embodiment increases the ROC to three times that available in the prior art while retaining concurrent sync detection and AFC as described previously. Also, it should be recognized that more delay offset stages/correlators could be added to increase the ROC further.

The present invention also encompasses a first method 900 of enabling automatic frequency control (AFC) concurrent with time alignment or frame synchronization of digital information in a communication device. The method 900 includes a first step 902 of comparing the digital information with a known reference source so as to determine a frequency error. A second step 904 includes correlating the digital information with a list of unique words of predetermined symbol sequences and associated aliases until a correlation is found. A third step 906 includes selecting the alias error based on which of the unique words and associated aliases was found in the correlating step. A fourth step 908 includes re-mapping the digital data based on the alias error so as to produce a corrected data stream. A fifth step 910 includes calculating a composite error including the frequency error and the alias error. A sixth step 912 includes simultaneously supplying the corrected data stream to the communication device and the composite error to an automatic frequency control such that frame synchronization can take place concurrently with AFC in the communication device.

The second step 904 includes correlating the digital information using at least one of the group of a bit-wise correlation, a symbol-wise correlation, and complex metric correlation. Preferably symbol-wise complex metric correlation is used for its increased operating speed. The correlation is performed using pre-defined unique words and associated aliases of the unique words. In a QPSK format, the aliases include three sets of orthogonal word aliases that would be received if the set of unique words were translated by $+\pi/2$, $-\pi/2$ and $+/-\pi$ radians per symbol. In a QPSK format, the incoming data stream includes words having symbols of two bits each, and the third step 906 provides one of four possible states depending on the aliasing error of the symbols of the digital information of the data stream.

In operation, the method 900 of the present invention has, as a result of the sixth step 912, the frequency error being usable in the AFC to provide fine error correction of less than about $\pm\pi/2_m$ radians of symbol phase error and the alias error being usable to provide coarse error correction of $\pm n\pi/2^m$ radians of symbol phase error where m is the number of bits per symbol in the modulation format being used and n is an even integer. The second step 904 is tested for correct correlation by correlating the data stream of the digital information until a correlation exceeds a predetermined threshold. Specifically, the threshold can be 0.7 to 0.8 depending on the correlation method chosen. For a symbol-wise complex correlation the threshold can be set at the lower limit if about 0.7.

Preferably the first method 900 of the present invention includes a step of applying the alias error to the AFC such that a composite error is less than about $\pm\pi/2_m$ radians per symbol from a phase null where m is the number of bits per symbol, and a step of applying the frequency error to the AFC such that a phase null is acquired at a correct symbol correlation.

The present invention also encompasses a preferred method 1400 of enabling automatic frequency control (AFC) concurrent with time alignment or frame synchronization of digital information in a communication device. The method 1400 includes a first step 1402 of providing a demodulated data stream of symbols to an AFC circuit. A second step 1404 includes applying a plurality of frequency offsets to an output of the AFC circuit wherein the frequency offsets are separated from each other by a frequency corresponding to a phase error of about $2\pi/2_m$ radians per symbol where m is the number of bits per symbol. For example, the frequency shift of the second step 1404 corresponds to an equivalent phase of about $\pi/2$ radians per symbol in a $\pi/4$ DQPSK system and $\pi/4$ radians per symbol in an 8-PSK system. A third step 1406 includes correlating each of the frequency offset signals with a list of unique words of a predetermined symbol sequence until a correlation is found. The frequency offset branch detecting correlation indicates the signal path having correctly aligned data since the unique words are orthogonal to each other preventing false correlation. A fourth step 1408 includes coupling the correct data stream of the frequency offset signal with the found correlation to an AFC logic circuit to indicate an AFC lock condition. A fifth step 1410 includes simultaneously supplying the correct data stream to the communication device and achieving AFC lock such that frame synchronization can take place concurrently with AFC in the communication device.

In practice, the correlating step includes correlating the frequency offset signals using at least one of the group of a bit-wise correlation, a symbol-wise correlation, and complex metric correlation. Also, in the providing step, the AFC providing fine frequency error correction of less than a period equivalent to about $\pm\pi/2^m$ radians per symbol where m is the number of bits per symbol, and the found correlation indicating coarse frequency error correction of periods equivalent to about $\pm n\pi/2^m$ radians per symbol where n is an even integer. Further the correlating step includes correlating the digital information until a correlation exceeds a predetermined threshold.

Although the invention has been described and illustrated in the above description and drawings, it is understood that this description is by way of example only and that numerous changes and modifications can be made by those skilled in the art without departing from the broad scope of the invention. For example, although the present invention finds particular application in portable cellular radiotelephones, the invention could be applied to any communication device, including pagers, electronic organizers, or computers.

What is claimed is:

1. A method of improving automatic frequency control (AFC) in a communication device, the method comprising the steps of:

comparing the digital information with a known reference source so as to determine a frequency error;

correlating the digital information with a list of predetermined symbol sequences and associated aliases until a correlation is found;

selecting the alias error based on which of the predetermined symbol sequences and associated aliases was found in the correlating step;

re-mapping the digital data based on the alias error so as to produce a corrected data stream;

calculating a composite error including the frequency error and the alias error; and supplying the composite error to an automatic frequency control such that a range of convergence of the AFC is expanded to greater than $\pm\pi/2^m$ radians per symbol where m is the number of bits per symbol used in the communication device.

2. The method of claim 1 wherein the supplying step includes simultaneously supplying the corrected data stream to the communication device and supplying the composite error to the automatic frequency control such that time alignment of the digital information with the predetermined symbol sequences takes place concurrently with the AFC in the communication device.

3. The method of claim 1 wherein the correlating step includes correlating the digital information using at least one of the group of a bit-wise correlation, a symbol-wise correlation, and complex metric correlation, and wherein the predetermined symbol sequences comprise a set of unique words.

4. The method of claim 1 wherein, in the correlating step, the associated aliases of the predetermined symbol sequences include sets of substantially orthogonal word aliases that would be received if the set of predetermined symbol sequences were translated by phase shifts of greater than or equal to about $\pm 2\pi/2_m$ radians per symbol where m equals the number of bits per symbol in the specific modulation format being used.

5. The method of claim 1 wherein, in the supplying step, the frequency error is usable in the AFC to provide fine error correction of less than about $\pm \pi/2_m$ radians of symbol phase error and the alias error is usable to provide coarse error correction of $\pm n\pi/2^m$ radians of symbol phase error where m equals the number of bits per symbol in the specific modulation format being used and n is an even integer.

6. The method of claim 1 wherein the comparing step includes words having symbols of two bits each, and the selecting step provides one of four possible states depending on the aliasing error of the symbols of the digital information.

7. The method of claim 1 wherein the correlating step includes correlating the digital information until a correlation exceeds a predetermined threshold.

8. The method of claim 1, further comprising the steps of:
applying the alias error to the AFC such that a composite error is less than about $\pm \pi/2^m$ radians per symbol from a phase null where m equals the number of bits per symbol in the specific modulation format being used; and
applying the frequency error to the AFC such that a phase null is acquired at a correct symbol correlation.

9. A digital communication device providing improved automatic frequency control (AFC), the communication device comprising:
a demodulator that provides a demodulated data stream and compares received incoming signals with a reference source so as to provide a frequency error signal;
a memory containing a list of predetermined symbol sequences and realizable aliases of the predetermined symbol sequences;
a correlator coupled to the demodulator and the memory, the correlator correlates the list of predetermined symbol sequences and associated aliases of the predetermined symbol sequences with the demodulated data stream until a correlation is found;
an alias case selector coupled to the correlator, the alias case selector outputs an alias error indicating which of the predetermined symbol sequences and associated aliases of the predetermined symbol sequences provided the found correlation;
a data re-mapper coupled to the alias case selector and the demodulated data stream, the data re-mapper correcting the data stream in accordance with the indicated alias error from the alias case selector; and
a composite error estimator input with the frequency error signal from the digital demodulator and the alias error from the alias case selector, the estimator combining the frequency error and the alias error for application to the AFC such that a range of convergence of the AFC is expanded to greater than $\pm \pi/2^m$ radians per symbol where m is the number of bits per symbol used in the communication device.

10. The communication device of claim 9 wherein the corrected data stream from the data re-mapper is supplied to the communication device simultaneous with the composite error being supplied to the automatic frequency control such that time alignment of the digital information with the predetermined symbol sequences takes place concurrently with the AFC in the communication device.

11. The communication device of claim 9 wherein the correlator correlates the demodulated data stream with the list of the stored memory utilizing at least one of the group of a bit-wise correlation, a symbol-wise correlation, and complex metric correlation, and wherein the predetermined symbol sequences comprise a set of unique words.

12. The communication device of claim 9 wherein the associated aliases of the predetermined symbol sequences include sets of substantially orthogonal word aliases that would be received if the set of predetermined symbol sequences were translated by phase shifts of $\pm 2\pi/2^m$ radians per symbol where m equals the number of bits per symbol in the specific modulation format being used.

13. The communication device of claim 9 wherein the frequency error provided by the digital demodulator is usable to provide fine error correction of less than about $\pm \pi/2^m$ radians of symbol phase error and the alias error is usable to provide coarse error correction of about $\pm n\pi/2^m$ radians of symbol phase error where m equals the number of bits per symbol in the specific modulation format being used and n is an even integer.

14. The communication device of claim 9 wherein the demodulated data stream includes words having symbols of two bits each, and the alias case selector provides one of four possible states depending on the aliasing error of the symbols of the demodulated data stream.

15. The communication device of claim 9 wherein the correlator determined a found correlation when the correlation exceeds a predetermined threshold.

16. The communication device of claim 9 wherein the composite frequency estimator applies the alias error to the AFC such that a composite error is less than about $\pm \pi/2^m$ radians per symbol from a phase null where m equals the number of bits per symbol in the specific modulation format being used and applies the frequency error to the AFC such that a phase null is acquired at a correct symbol correlation.

17. The communication device of claim 9 wherein the communication device is a portable radiotelephone.

18. A digital communication device providing improved automatic frequency control (AFC), the communication device comprising:
a demodulator that provides a demodulated data stream of symbols to an AFC;
a memory containing a list of predetermined symbol sequences for time alignment of the communication device;
an offset bank coupled to the demodulated data stream from the AFC, the offset bank provides at least three signal paths for the demodulated data stream, each signal path having a frequency offset differing from one another by an equivalent of about $2\pi/2^m$ radians per symbol where m equals the number of bits per symbol in the specific modulation format being used;
at least three synchronization detector correlators coupled to the memory and associated signal paths from the offset bank, the correlators correlate the list of predetermined symbol sequences in the memory with the associated frequency offset demodulated data streams until a correlation is found; and a logic circuit coupled to the correlators, the logic circuit outputs the correct data stream from the correlator that indicates a found correlation to the communication device such that a range of convergence of the AFC is expanded to greater than $\pm\pi/2_m$ radians per symbol.

19. The communication device of claim 18 wherein the correct data stream from the logic circuit is supplied to the communication device simultaneous with the logic circuit indicating an AFC lock responsive to the found correlation such that time alignment of the digital information with the predetermined symbol sequences takes place concurrently with the AFC in the communication device.

20. The communication device of claim 18 wherein the correlator correlates the demodulated data stream with the list of the stored memory utilizing at least one of the group of a bit-wise correlation, a symbol-wise correlation, and complex metric correlation, and wherein the predetermined symbol sequences comprise a set of unique words.

21. The communication device of claim 18 wherein the AFC is usable to provide fine error correction of less than about $\pm\pi/2^m$ radians of symbol phase error and the indicated offset from the offset bank is usable to provide coarse error correction of about $\pm n\pi/2^m$ radians of symbol phase error where m equals the number of bits per symbol in the specific modulation format being used and n is an even integer.

22. The communication device of claim 18 wherein the correlators determine a found correlation when the correlation exceeds a predetermined threshold indicating AFC lock.

23. The communication device of claim 18 wherein the communication device is a portable radiotelephone.

24. A method of improving automatic frequency control (AFC) in a communication device, the method comprising the steps of:

providing a demodulated data stream of symbols to an AFC circuit;

applying a plurality of frequency offsets to an output of the AFC circuit wherein the frequency offsets are separated from each other by a frequency shift equivalent to of $2\pi/2_m$ radians of symbol phase where m equals the number of bits per symbol in the specific modulation format being used;

correlating each of the frequency offset signals with a list of predetermined symbol sequences until a correlation is found;

coupling the correct data stream of the frequency offset signal with the found correlation to a logic circuit to indicate an AFC lock condition; and supplying the correct data stream to the communication device and achieving AFC lock such that a range of convergence of the AFC is expanded to greater than $\pm\pi/2_m$ radians per symbol.

25. The method of claim 24 wherein the supplying step includes simultaneously supplying the corrected data stream to the communication device and achieving AFC lock such that time alignment of the digital information with the predetermined symbol sequences takes place concurrently with the AFC in the communication device.

26. The method of claim 24 wherein the correlating step includes correlating the frequency offset signals using at least one of the group of a bit-wise correlation, a symbol-wise correlation, and complex metric correlation, and wherein the predetermined symbol sequences comprise a set of unique words.

27. The method of claim 24 wherein, in the providing step, the AFC providing fine frequency error correction of less than an equivalent of about $\pm\pi/2^m$ radians of symbol phase and the found correlation indicating coarse frequency error correction of an equivalent of about $\pm n\pi/2^m$ radians of symbol phase where m equals the number of bits per symbol in the specific modulation format being used and n is an even integer.

28. The method of claim 24 wherein the correlating step includes correlating the digital information until a correlation exceeds a predetermined threshold.

* * * * *

UNITED STATES PATENT AND TRADEMARK OFFICE
CERTIFICATE OF CORRECTION

PATENT NO.    : 6,560,298 B1
DATED         : May 6, 2003
INVENTOR(S)   : Froehling et al.

It is certified that error appears in the above-identified patent and that said Letters Patent is hereby corrected as shown below:

Column 15,
Line 12, reads "$\pm 2\pi/2_m$", should read -- $\pm 2\pi/2^m$ --.
Line 17, reads "$\pm \pi/2_m$", should read -- $\pm \pi/2^m$ --.

Column 17,
Line 5, reads "$\pm \pi/2_m$", should read -- $\pm \pi/2^m$ --.

Column 18,
Line 1, reads "$2\pm \pi/2_m$", should read -- $2\pi/2^m$ --.
Line 13, reads "$\pm \pi/2_m$", should read -- $\pm \pi/2^m$ --.

Signed and Sealed this

Sixteenth Day of September, 2003

JAMES E. ROGAN
*Director of the United States Patent and Trademark Office*